United States Patent [19]

Seinecke

[11] Patent Number: 4,847,553
[45] Date of Patent: Jul. 11, 1989

[54] NEEDLE CARD CONTACTING MECHANISM FOR TESTING MICRO-ELECTRONIC COMPONENTS

[75] Inventor: Siegfried Seinecke, Starnberg, Fed. Rep. of Germany

[73] Assignee: Siemens Aktiengesellschaft, Berlin and Munich, Fed. Rep. of Germany

[21] Appl. No.: 90,576

[22] Filed: Aug. 28, 1987

[30] Foreign Application Priority Data

Aug. 29, 1986 [DE] Fed. Rep. of Germany ....... 3629407
Jul. 16, 1987 [DE] Fed. Rep. of Germany ....... 3723570

[51] Int. Cl.⁴ .................... G01R 1/06; G01R 31/02
[52] U.S. Cl. ......................... 324/158 P; 324/158 F; 324/73 PC; 324/72.5
[58] Field of Search ........... 324/158 F, 158 P, 73 PC, 324/72.5; 439/65, 74, 75

[56] References Cited

U.S. PATENT DOCUMENTS

| | | | |
|---|---|---|---|
| 3,445,770 | 5/1969 | Harmon | 324/158 P |
| 3,613,001 | 10/1971 | Hostetter | 324/72.5 X |
| 3,867,698 | 2/1975 | Beltz et al. | 324/158 P X |
| 4,186,988 | 2/1980 | Kobler | 439/75 X |
| 4,382,228 | 5/1983 | Evans | 324/72.5 X |
| 4,623,839 | 11/1986 | Garretson et al. | 324/158 P X |
| 4,649,339 | 3/1987 | Graneroth et al. | 324/158 F X |
| 4,777,716 | 10/1988 | Folk et al. | 324/158 F X |

FOREIGN PATENT DOCUMENTS 55-23437  2/1980  Japan ............... 324/158 P

Primary Examiner—Reinhard J. Eisenzopf
Assistant Examiner—Vinh P. Nguyen

[57] ABSTRACT

A contacting mechanism in the form of what is referred to as a needle card for micro-electronic components to be tested and having a large number of poles. Contacting needles of the contacting card are fashioned U-shaped and are arranged such that one of the two legs of the needles projects perpendicularly down through a narrowly toleranced guide hole in the needle card, its tip pressing resiliently against a contact spot of the component to be tested. The other leg of the needles is connected to leads of testing equipment. A part of the needles connecting the two legs is fashioned straight-line and is arranged at a close distance to the needle card.

12 Claims, 2 Drawing Sheets

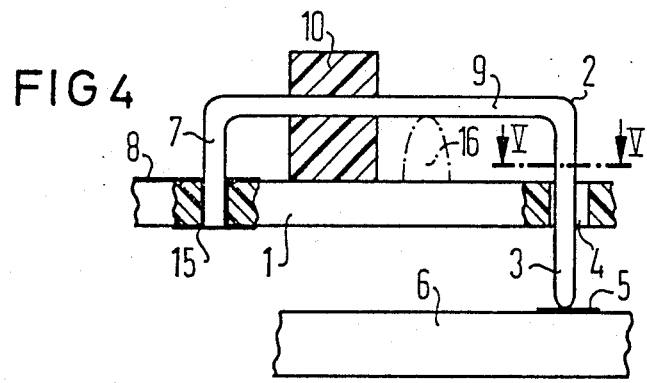
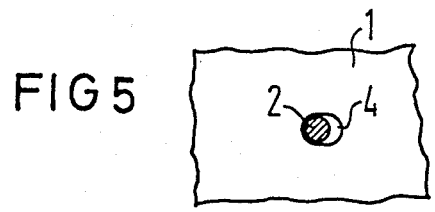

NEEDLE CARD CONTACTING MECHANISM FOR TESTING MICRO-ELECTRONIC COMPONENTS

BACKGROUND OF THE INVENTION

The invention is directed to a contacting mechanism for micro-electronic components, particularly LSI circuits, to be tested and having a large number of poles. The contacting mechanism is in the form of a needle card having a plurality of contacting needles corresponding in number to the plurality of contacts of the component to be tested.

Modern micro-electronic components, such as, for example, LSI circuits as a chip on a silicone wafer, must be contacted by testing equipment such that the contacting mechanism itself only generates slight electrical disturbances (such as, for example, series inductances, grounded capacitances and electro-magnetic couplings as well as ohmic contact resistances). Only then can the electrical properties of the component be faultlessly measured. Error-free measurements at sub-nano second circuits and chips, however, are difficult to execute or cannot be executed at all with traditional contacting mechanisms because the LSI components are being increasingly given finer and finer contact divisions. A contacting with the hitherto standard design and dimension of individual springs thus has structural limits and generates electrical disturbances. A contacting by employing flexible printed circuits in combination with an elastic pressure pillow does not necessarily lead to uniform contacting forces for all contacts. This also encounters difficulties for yet another reason. When the number of contacts of the component to be tested is so high that they can no longer all be arranged in a single row at the edge of the component, it has not been hitherto possible to utilize flexible printed circuits that could be contacted to the contact spots of the components arranged in a plurality of rows following one another. The chip contacting on wafers is therefore currently still carried out with sensing needles.

A number of solutions have been disclosed for the fashioning of such contacting mechanisms having a plurality of sensing needles, which are provided in what is referred to as a needle card, corresponding in number to the plurality of contacts of the component to be tested. Thus, for example, it is known to provide contacting needles freely projecting in a downward direction at an angle away from the edge of the inner opening of the needle card, these contacting needles respectively pressing against the respective contact spots of the component with a free end that is bent downwardly away. Due to the slight distances between the contact spots of the components and their dimensions, which are extremely small, the manufacture of such a contacting mechanism is extraordinarily difficult given a contacting mechanism for testing components having an extremely high number of poles.

It has been proposed to guide those ends of the contact needles serving the purpose of contacting in guide holes of a plate which is arranged above the component to be tested. The needles project away from this plate bent slightly in upward direction and are embedded in a shared block at their end. As a result of the slight bending of the needles, the needles can deflect somewhat laterally when pressed against the component to be respectively tested and thus enable a resilient contact pressing. The disadvantage of this arrangement is that the contacting needles do not lead upwardly away from the needle card in the direction of the needle card, but perpendicularly thereto and thus generate great electrical disturbances as a consequence of their length and position. Further, a replacement of individual needles is not possible at all if they are damaged in this contacting mechanism.

It has also been proposed to guide the individual contact needles in small, thin tubes which are all cast with one another in what is referred to as a contact block and, thus, reliably hold their spacings. The disadvantage of these contacting mechanisms is that the cross-section of the needles must be greatly reduced given a slight spacing between the contacts of the component to be tested since, of course, they are also guided in the small guide tubes. Further, the contacting between needles and guide tube is unreliable. Since all small guide tubes are cast out in the contact block, the replacement of individual needles is possible, but the replacement of damaged guide tubes is not possible.

SUMMARY OF THE INVENTION

The invention is therefore based on the object of creating a contacting mechanism of the species initially cited which, in contrast to the known contacting mechanisms, does not produce any great electricaly disturbances, which can be manufactured with high precision and in a largely mechanized fashion, and wherein the individual contact needles or groups or needles can be replaced at any time.

This is inventively achieved in that the contacting needls are fashioned U-shaped and are arranged such that the one of the two legs of the needles projects perpendicularly down through a narrowly toleranced guide hole in the needle card and its tip presses resiliently against the contact spot of the component to be tested. The other leg of the needles is connected by leads to the testing equipment. The part of the needles connecting the two legs is fashioned straight-line and is arranged at a close distance parallel to the needle card.

BRIEF DESCRIPTION OF THE DRAWINGS

The features of the present invention which are believed to be novel, are set forth with particularity in the appended claims. The invention, together with further objects and advantages, may be best understood by reference to the following description taken in conjunction with the accompanying drawings, in the several figures of which like reference numerals identify like elements, and in which;

FIG. 4 is a schematic illustration showing a part of the contacting mechanism having an oblong hole; and FIG. 5 is a top view of the oblong hole of FIG. 4.

DESCRIPTION OF THE PREFERRED EMBODIMENT

Figure 1:
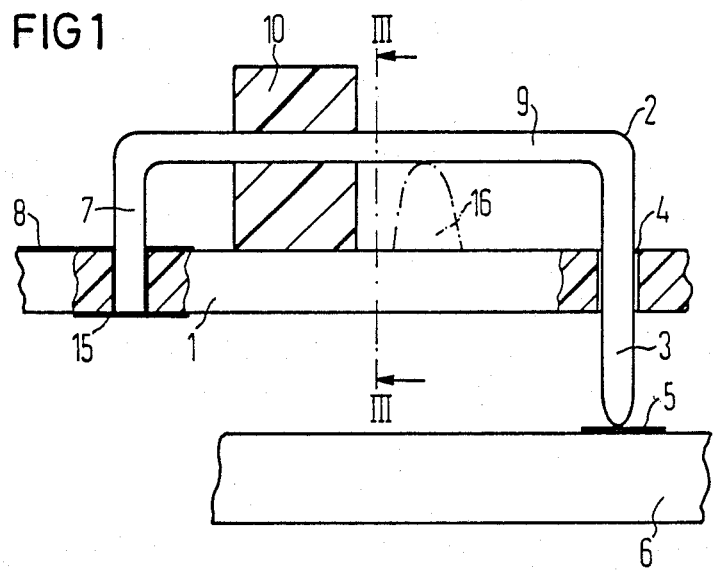
FIG. 1 shows a schematic illustration of the contacting mechanism of the invention.
Figure 2:
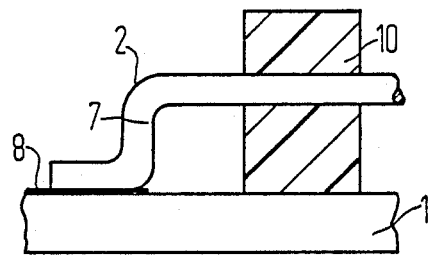
FIG. 2 shows a schematic illustration of an alternative embodiment for connecting one end of the contacting needle to the lead of the testing equipment.

In a schematic and partially cut away view, FIG. 1 shows a part of an inventive contacting mechanism composed of a needle card 1, of a contacting needle 2 and of a base 10 applied to the upperside of the needle card 1. As may be seen from FIG. 1, the contacting needle 2 is fashioned U-shaped and is arranged such that one leg 3 of the needle 2 projects perpendicularly down through a narrowly toleranced guide hole 4 in the needle card 1 and has its tip pressing resiliently against the contact spot 5 of the component 6 to be tested. The other leg 7 of the needle 2 is connected to the allocated lead 8 connected in turn to the testing equipment. In the case of the example of FIG. 1, the leg 7 is soldered into a through-contacted bore 15 in the needle card 1. As shown in FIG. 2, however, it is also possible to bend the leg 7 of the needle 2 and to directly connect it to the lead 8 of the testing equipment.

As may also be seen from FIG. 1, that part 9 connecting the two legs 3 and 7 of the needle 2 is fashioned straight-line and is arranged at a close distance (for example, parallel) to the needle card 1. This has the great advantage that all parts of the needle 2 are situated in the immediate proximity of the needle card 1, are short and that the lead 8 from the needle 2 to the testing equipment can essentially lie in the plane of the needle card 1.

Figure 3:
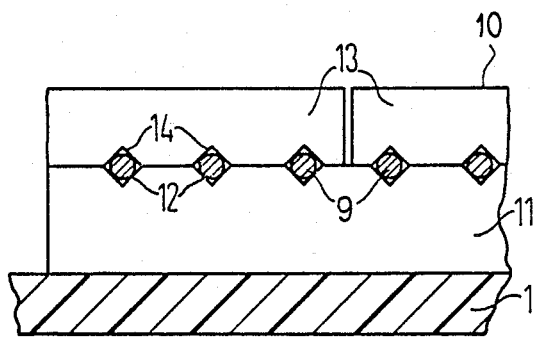
FIG. 3 is an end view showing a base for seating the contacting needles.

It may be seen from FIG. 1 and, in particular, from FIG. 3 that, given the illustrated exemplary embodiment, the parts 9, connecting the legs in all needles 2, are seated in a base 10 applied to the upperside of the needle card 1. It is especially advantageous to fashion this base 10 in bipartite fashon, whereby at least a lower part 11 is provided with notches 12 into which the parts 9 of the needles connecting the legs are seated and retained. An especially reliable holding and seating of these parts of the needles 2 is obtained when corresponding notches 14 are also provided in the upper part 13 of the base.

By arranging, for example, a block 16 under the needles 2, the needles 2, held in the base 10, can be prestressed.

Possible as a result of the seating of the needles 2 in a base 10 as described above is that individual needles or groups of needles that are damaged can be removed and replaced by new needles by lifting of the corresponding upper part 13 of the base 10.

Further, the design and arrangement of the individual parts of the inventive contacting mechanism makes it possible to manufacture all parts in a high-precision and largely mechanized fashion and, by simple insertion of the needles into the notches 12 or, respectively, 14 of the base 10, to adjust them simply, quickly and precisely. Further, the contacting mechanism of the present invention is significantly more cost-beneficial in manufacture and repair as a consequence of the considerably reduced time-outlay.

FIG. 4 shows the same arrangement as FIG. 1, except that the guide hole is fashioned as an oblong hole. A top view of the oblong hole is shown in FIG. 5.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A contacting mechanism for micro-electronic components, particularly LSI circuits, to be tested and having a great number of poles, said contacting mechanism being in the form of a needle card having a plurality of contacting needles corresponding in number to the plurality of contacts of the component to be tested, comprising: the contacting needles fashioned U-shaped and arranged such that one of two legs of the needles project perpendicularly down through a narrowly toleranced guide hole in the needle card, its tip pressing resiliently against a contact spot of the component to be tested; the respectively other leg of the needles connected to leads of testing equipment; and a part of the needles connecting the two legs fashioned straight-line and arranged at a close distance to the needle card, those parts of the needles connecting the legs being seated in a base attached to the upper side of the needle card.

2. The contacting mechanism according to claim 1, wherein the base is composed of a lower part and at least one upper part, a lower part being provided with notches and rigidly attached to an upper side of the needle card and the upper part being provided with notches which mate with the notches in the lower part and which serve the purpose of covering the part of the needles connecting the two legs.

3. The contacting mechanism according to claim 1, wherein the guide hole is fashioned as a round hole.

4. The contacting mechanism according to claim 1, wherein the guide hole is fashioned as an oblong hole.

5. The contacting mechanism according to claim 1 wherein the guide hole is fashioned as an oblong hole oriented in a longitudinal direction with respect to the part of the needle connecting the two legs.

6. A contacting mechanism for use with at least one micro-electronic component having a plurality of contact spots, comprising:
   a plurality of contacting needles on a needle card for contacting said plurality of contact spots, at least one of said contacting needles fashioned U-shaped and having first and second legs connected by a substantially straight part, said needle card having a plurality of narrowly toleranced guide holes in a one-to-one correspondence with said plurality of contacting needles;
   said first leg of each contacting needles projecting perpendicular to an upper side of said needle card down through said corresponding narrowly toleranced guide hole in said needle card with a top of said first leg pressing resiliently against a corresponding contact spot of said component;
   said second leg of each contacting needle connected to an electrical lead; and
   said substantially straight part of each contacting needle located closely adjacent said upper side of said needle card, said substantially straight part being seated in a base attached to said upper side of said needle card.

7. The contacting mechanism according to claim 6, wherein said base has a lower part and an upper part, said lower part provided with notches, said lower part rigidly attached to said upper side of said needle card; and at least one upper part provided with notches in corresponding arrangement with said notches of said lower part, said upper part removably secured to said lower part and wherein a predetermined portion of said substantially straight part is held in said notches.

8. The contacting mechanism according to claim 6, wherein said guide hole is fashioned as a round hole.

9. The contacting mechanism according to claim 6, wherein said guide hole is fashioned as an oblong hole.

10. The contacting mechanism according to claim 6 wherein the guide hole is fashioned as an oblong hole oriented in a longitudinal direction with respect to the substantially straight part connecting the first and second legs.

11. A contacting mechanism for micro-electronic components, particularly LSI circuits, to be tested and having a great number of poles, said contacting mechanism being in the form of a needle card having a plurality of contacting needles corresponding in number to the plurality of contacts of the component to be tested, comprising: the contacting needles fashioned U-shaped and arranged such that one of two legs of the needles project perpendicularly down through a narrowly toleranced guide hole in the needle card, its tip pressing resiliently against a contact spot of the component to be tested; the respectively other leg of the needles connected to leads of testing equipment; and parts of the needles connecting the two legs fashioned straight-line and arranged at a close distance to the needle card, said parts of the needles being seated in a base attached to an upper side of said needle card, the guide hole being fashioned as an oblong hole oriented in a longitudinal direction with respect to the part of the needle connecting the two legs.

12. A contacting mechanism for use with at least one micro-electronic component having a plurality of contact sports, comprising:
  a plurality of contacting needles on a needle card for contacting said plurality of contact spots, at least one of said contacting needles fashioned U-shaped and having first and second legs connected by a substantially straight part, said needle card having a plurality of narrowly toleranced guide holes in a one-to-one correspondence with said plurality of contacting needles;
  said first leg of each contacting needle projecting perpendicular to an upper side of said needle card down through said corresponding narrrowly toleranced guide hole in said needle card with a tip of said first leg pressing resiliently against a corresponding contact spot of said component;
  said second leg of each contacting needle connected to an electrical lead; and
  said substantially straight part of each contacting needle located closely adjacent said upper side of said needle card, said straight part being seated in a base attached to said upper side of said needle card the guide hole being fashioned as an oblong hole oriented in a longitudinal direction with respect to the substantially straight part connecting the first and second legs.

* * * * *